US011377627B2

(12) United States Patent
Yoshizaki et al.

(10) Patent No.: US 11,377,627 B2
(45) Date of Patent: Jul. 5, 2022

(54) COMPOSITION FOR SURFACE TREATMENT, METHOD FOR PRODUCING THE SAME, AND SURFACE TREATMENT METHOD USING THE SAME

(71) Applicant: FUJIMI INCORPORATED, Kiyosu (JP)

(72) Inventors: Yukinobu Yoshizaki, Kiyosu (JP); Koichi Sakabe, Kiyosu (JP); Satoru Yarita, Kiyosu (JP); Kenichi Komoto, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 125 days.

(21) Appl. No.: 16/492,338

(22) PCT Filed: Jan. 23, 2018

(86) PCT No.: PCT/JP2018/001953
§ 371 (c)(1),
(2) Date: Sep. 9, 2019

(87) PCT Pub. No.: WO2018/168207
PCT Pub. Date: Sep. 20, 2018

(65) Prior Publication Data
US 2021/0130751 A1    May 6, 2021

(30) Foreign Application Priority Data

Mar. 14, 2017   (JP) .............................. JP2017-048630

(51) Int. Cl.
C11D 7/34 (2006.01)
C11D 11/00 (2006.01)
C11D 7/10 (2006.01)
C11D 7/20 (2006.01)
C11D 7/26 (2006.01)
C11D 7/32 (2006.01)
C11D 7/36 (2006.01)
H01L 21/02 (2006.01)
B08B 1/00 (2006.01)
B08B 3/02 (2006.01)
B08B 3/08 (2006.01)

(52) U.S. Cl.
CPC ............ *C11D 11/0047* (2013.01); *C11D 7/10* (2013.01); *C11D 7/105* (2013.01); *C11D 7/20* (2013.01); *C11D 7/265* (2013.01); *C11D 7/266* (2013.01); *C11D 7/3218* (2013.01); *C11D 7/34* (2013.01); *C11D 7/36* (2013.01); *H01L 21/02057* (2013.01); *B08B 1/002* (2013.01); *B08B 3/02* (2013.01); *B08B 3/08* (2013.01)

(58) Field of Classification Search
CPC .................................. C11D 11/0047

USPC ........................................................ 510/175
See application file for complete search history.

(56) References Cited

U.S. PATENT DOCUMENTS

| 6,440,856 | B1 | 8/2002 | Bessho | |
|---|---|---|---|---|
| 2005/0176606 | A1* | 8/2005 | Konno | ................ C11D 3/3765 510/175 |
| 2010/0286014 | A1* | 11/2010 | Barnes | ............. H01L 21/02074 510/175 |
| 2011/0245127 | A1* | 10/2011 | Suzuki | ................... C11D 1/008 510/163 |
| 2017/0330763 | A1* | 11/2017 | Kamei | ...................... C09G 1/02 |
| 2019/0093056 | A1* | 3/2019 | Yoshino | ............. C11D 11/0047 |
| 2019/0168265 | A1* | 6/2019 | White | ....................... B08B 1/02 |
| 2020/0294808 | A1* | 9/2020 | Ishida | ............. H01L 21/02052 |

FOREIGN PATENT DOCUMENTS

| JP | 2001-064689 A | 3/2001 |
|---|---|---|
| JP | 2005-255983 A | 9/2005 |
| JP | 2013-008751 A | 1/2013 |
| JP | 2015-181079 A | 10/2015 |
| JP | 2017-011225 A | 1/2017 |
| TW | 200527519 A | 8/2005 |

OTHER PUBLICATIONS

Office Action issued in corresponding Japanese Patent Application No. 2019-505740 dated Jul. 27, 2021 with English translation.
Office Action issued in corresponding Taiwanese Patent Application No. 107103446, dated Mar. 23, 2021, with English translation.
Office Action issued in corresponding Korean Patent Application No. 10-2019-7026469 dated Jan. 20, 2022 with English translation.
Office Action issued in corresponding Japanese Patent Application No. 2019-505740 dated Jan. 4, 2022 with English translation.

* cited by examiner

*Primary Examiner* — Gregory E Webb
(74) *Attorney, Agent, or Firm* — Foley & Lardner LLP

(57) ABSTRACT

The present invention provides a means by which it is possible to sufficiently suppress an organic residue while favorably decreasing a ceria residue on a polished object to be polished obtained after being polished using a polishing composition containing ceria.
The present invention relates to a composition for surface treatment, which is for a surface treatment of a polished object to be polished obtained after being polished using a polishing composition containing ceria, contains a carboxy group-containing (co)polymer having a structural unit derived from a monomer having a carboxy group or a salt group of the carboxy group, a $SO_x$ or $NO_y$ partial structure-containing compound having a partial structure represented by $SO_x$ or $NO_y$ (where x and y each independently denote a real number 1 to 5), and a dispersing medium, and has a pH of 1 or more and 8 or less.

18 Claims, No Drawings

COMPOSITION FOR SURFACE TREATMENT, METHOD FOR PRODUCING THE SAME, AND SURFACE TREATMENT METHOD USING THE SAME

TECHNICAL FIELD

The present invention relates to a composition for surface treatment, a method for producing the same, and a surface treatment method using the same.

BACKGROUND ART

In recent years, so-called chemical mechanical polishing (CMP) technique to physically polish and flatten a semiconductor substrate is utilized when manufacturing a device in association with the formation of multilayer wiring on the surface of a semiconductor substrate. CMP is a method in which the surface of an object to be polished (object to be polished) such as a semiconductor substrate is flattened using a polishing composition (slurry) containing abrasive grains such as silica, alumina, ceria and the like, an anticorrosive, a surfactant and the like, and the object to be polished (object to be polished) is wiring, plug or the like formed of silicon, polysilicon, silicon oxide, silicon nitride, a metal or the like.

A large amount of impurities (defects) remain on the surface of the semiconductor substrate after the CMP step. The impurities include abrasive grains derived from the polishing composition used in CMP, metals, anticorrosives, organic substances such as surfactants and the like, silicon-containing materials and metals which are generated by polishing silicon-containing materials, metal wiring, plugs, and the like that are objects to be polished, further organic substances such as pad waste generated from various kinds of pads and the like, and the like.

There is the possibility that the electrical properties of the semiconductor are adversely affected and the reliability of the device decreases when the surface of the semiconductor substrate is contaminated with these impurities. Hence, it is desirable to introduce a washing step after the CMP step and thus to remove these impurities from the surface of the semiconductor substrate.

As a technique to remove such impurities, JP 2001-64689 A (corresponding to U.S. Pat. No. 6,440,856) discloses a semiconductor component washing solution containing a water-soluble (co)polymer (salt) containing a sulfonic acid (salt) group and/or a carboxylic acid (salt) group as an essential constituent. Moreover, the literature discloses that it is possible to decrease impurities which remain on the semiconductor substrate after CMP and are based on the abrasive grains such as silica, alumina and the like, metal impurities, or metal wiring while diminishing the load on the environment by washing the semiconductor substrate using such a semiconductor component washing solution.

SUMMARY OF INVENTION

However, in the washing solution according to JP 2001-64689 A, there is a problem that it is difficult to remove the particle residues derived from ceria in a case in which the polishing composition used when polishing an object to be polished contains ceria ($CeO_2$) as an abrasive grain. Hence, a surface treatment using a mixture of sulfuric acid and hydrogen peroxide solution has been further required to remove the particle residues derived from ceria.

In addition, in the washing solution according to JP 2001-64689 A, there is a problem that the organic residues on the polished object to be polished cannot be sufficiently removed.

Accordingly, an object of the present invention is to provide a means by which it is possible to sufficiently suppress an organic residue while favorably decreasing a ceria residue on a polished object to be polished obtained after being polished using a polishing composition containing ceria.

In order to solve the above problems, the present inventors have intensively conducted studies. As a result, it has been found out that the above problems can be solved by using a (co)polymer having a structural unit derived from a monomer having a carboxy group or a salt group thereof concurrently with a compound having a partial structure represented by $SO_x$ or $NO_y$, and the present invention has been thus completed.

In other words, the present invention relates to a composition for surface treatment, which is for a surface treatment of a polished object to be polished obtained after being polished using a polishing composition containing ceria, contains:

a carboxy group-containing (co)polymer having a structural unit derived from a monomer having a carboxy group or a salt group of the carboxy group;

a $SO_x$ or $NO_y$ partial structure-containing compound having a partial structure represented by $SO_x$ or $NO_y$ (where x and y each independently denote a real number 1 to 5); and a dispersing medium, and has a pH of 1 or more and 8 or less.

DESCRIPTION OF EMBODIMENTS

Hereinafter, the present invention will be described. Incidentally, the present invention is not limited only to the following embodiments. In the present specification, "X to Y" indicating a range means "X or more and Y or less". In addition, in the present specification, operations, measurements, and the like of physical properties are performed under the conditions of room temperature (20° C. to 25° C.)/relative humidity of 40% to 50% RH unless otherwise stated.

In addition, in the present specification, (meth)acrylic is a generic term including acrylic and methacrylic and a (meth)acrylate is a generic term including an acrylate and a methacrylate.

<Defect>

The composition for surface treatment according to the present invention is used to decrease the defects (impurities, foreign matters) remaining on the surface of a polished object to be polished (hereinafter also referred to as an "object to be subjected to surface treatment").

The composition for surface treatment according to the present invention has a high removing effect regardless of the kind of defect but exhibits an extremely high effect of removing particularly ceria residues (for example, particle residues derived from ceria) and organic residues. Hence, it is preferable that the composition for surface treatment according to the present invention is used to decrease the ceria residues and organic residues on the surface of a polished object to be polished.

In addition, ceria residues on the surface of a polished object to be polished obtained after being polished using a polishing composition containing ceria are usually present as particle residues. Hence, it is preferable that the composition for surface treatment according to the present invention is used to decrease the particle residues and organic residues on the surface of a polished object to be polished.

Among the defects, the particle residue, the organic residue, and the other residues are greatly different from one another in color and shape. Here, the organic residue refers to a component formed of an organic compound such as an organic low molecular weight compound or a polymer compound, a salt thereof and the like among the defects attached to the surface of an object to be subjected to surface treatment. The particle residue refers to a component derived from a granular inorganic substance such as abrasive grains (for example, abrasive grains containing ceria) contained in a polishing composition among the defects attached to the surface of an object to be subjected to surface treatment. The other residues include residues formed of components other than the particle residues and the organic residues and a mixture of the particle residues, the organic residues, and the like. For this reason, the judgement on the kind of defect can be visually performed using a photograph in the SEM observation. Incidentally, the elemental analysis using an energy dispersive X ray analyzer (EDX) may be utilized for the judgment if necessary.

<Composition for Surface Treatment>

According to an aspect of the present invention, a composition for surface treatment is provided which is for a surface treatment of a polished object to be polished obtained after being polished using a polishing composition containing ceria, contains a carboxy group-containing (co)polymer having a structural unit derived from a monomer having a carboxy group or a salt group thereof (herein also referred to simply as a carboxy group-containing (co)polymer), a $SO_x$ or $NO_y$ partial structure-containing compound having a partial structure represented by $SO_x$ or $NO_y$ (where x and y each independently denote a real number 1 to 5) (herein also referred to simply as a $SO_x$ or $NO_y$ partial structure-containing compound), and a dispersing medium, and has a pH of 1 or more and 8 or less. According to an aspect of the present invention, there is provided a means by which it is possible to sufficiently suppress an organic residue while favorably decreasing a ceria residue on a polished object to be polished obtained after being polished using a polishing composition containing ceria.

The present inventors presume the mechanism by which both particle residues and organic residues on a polished object to be polished obtained after being polished using a polishing composition containing ceria can be decreased by such a configuration as follows.

Impurities such as ceria residues (particularly, particle residues derived from ceria) contained in the polishing composition, organic compounds (organic residues) derived from organic compounds contained in the polishing composition, pad waste and the like, and the like are present on the polished object to be polished or in the composition for surface treatment.

The $SO_x$ or $NO_y$ partial structure-containing compound has ability to form a complex with ceria and thus forms a complex with the ceria residue. As a result, the dispersibility of ceria residues is improved and the ceria residues are more easily removed.

In addition, the carboxy group-containing (co)polymer is coordinated having the carboxy group facing the organic residue side and the opposite side thereto (composition for surface treatment side) in a case in which the organic residues are hydrophilic. In addition, the carboxy group-containing (co)polymer is coordinated having the hydrophobic moiety facing the organic residue side and the carboxy group facing the opposite side thereto (composition for surface treatment side) in a case in which the organic residues are hydrophobic. Moreover, with regard to the polished object to be polished as well, the carboxy group-containing (co)polymer is coordinated having the carboxy group facing the polished object to be polished side and the opposite side thereto (composition for surface treatment side) in a case in which this is hydrophilic, and the carboxy group-containing (co)polymer is coordinated having the hydrophobic moiety facing the polished object to be polished side and the carboxy group facing the opposite side thereto (composition for surface treatment side) in a case in which this is hydrophobic in the same manner as the above. As a result, the organic residues are more easily removed and the reattachment of the organic residues to the polished object to be polished is suppressed by the improvement in dispersibility and the potential repulsion due to the coordination of the carboxy group-containing (co)polymer.

Incidentally, the mechanism is based on presumption and the present invention is not limited to the mechanism at all. Hereinafter, the configuration of the composition for surface treatment according to an aspect of the present invention will be described in detail.

((Co)polymer having structural unit derived from monomer having carboxy group or salt group thereof)

The composition for surface treatment according to an aspect of the present invention contains a carboxy group-containing (co)polymer having a structural unit derived from a monomer having a carboxy group or a salt group thereof. The carboxy group-containing (co)polymer has an action of facilitating the removal of organic residues derived from the organic compounds contained in the polishing composition, pad waste and the like.

The monomer having a carboxy group or a salt group thereof is not particularly limited but is preferably a carboxy group-containing vinyl monomer having a carboxy group and having a polymerizable double bond.

The carboxy group-containing vinyl-based monomer is not particularly limited, but examples thereof include (meth)acrylic acid, α-haloacrylic acid, maleic acid, maleic anhydride, maleic acid monoalkyl ester, itaconic acid, vinyl acetate, allyl acetate, cinnamic acid, fumaric acid, fumaric acid monoalkyl ester, crotonic acid, itaconic acid, itaconic acid monoalkyl ester, itaconic acid glycol monoether, citraconic acid, citraconic acid monoalkyl ester and the like. One kind of these may be used singly, or two or more kinds thereof may be used in combination. Among these, (meth)acrylic acid is preferable, and acrylic acid is more preferable. In other words, the carboxy group-containing (co)polymer is preferably a (co)polymer having a structural unit derived from (meth)acrylic acid or a salt thereof and more preferably a (co)polymer having a structural unit derived from acrylic acid or a salt thereof.

In a copolymer having a structural unit derived from a monomer having a carboxy group or a salt group thereof and a structural unit derived from another monomer, the main chain thereof may be composed only of carbon atoms or oxygen atoms, nitrogen atoms, or phosphorus atoms may be contained at a part of the main chain in addition to carbon atoms.

The structural unit derived from another monomer in the copolymer having a structural unit derived from a monomer having a carboxy group or a salt group thereof and a structural unit derived from another monomer is not particularly limited, and known ones can be used.

Examples of another monomer which constitutes the structural unit derived from another monomer include ethylenically unsaturated monomers other than the carboxy group-containing vinyl-based monomer, diamines, diepoxides, hypophosphorous acid or salts thereof, and the like.

The ethylenically unsaturated monomer is not particularly limited, and examples thereof include styrene monomers such as styrene, o-methylstyrene, m-methylstyrene, p-methylstyrene, α-methylstyrene, p-phenyl styrene, p-ethyl styrene, 2,4-dimethyl styrene, p-tert-butyl styrene, p-n-hexyl styrene, p-n-octylstyrene, p-n-nonylstyrene, p-n-decylstyrene, p-n-dodecyl styrene, styrenesulfonic acid and the like; (meth)acrylic acid ester monomers such as methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, n-octyl (meth)acrylate, 2-ethylhexyl (meth)acrylate, stearyl (meth)acrylate, lauryl (meth)acrylate, phenyl (meth)acrylate, diethylaminoethyl (meth)acrylate, dimethylaminoethyl (meth)acrylate and the like; olefin monomers such as ethylene, propylene, isobutylene and the like; vinyl ester monomers such as vinyl propionate, vinyl acetate, vinyl benzoate and the like; vinyl ether monomers such as vinyl methyl ether, vinyl ethyl ether and the like; vinyl ketone monomers such as vinyl methyl ketone, vinyl ethyl ketone, vinyl hexyl ketone and the like; N-vinyl monomers such as N-vinylcarbazole, N-vinyl indole, N-vinyl formamide, N-vinyl pyrrolidone and the like; heterocyclic vinyl monomers such as vinyl naphthalene, vinyl pyridine and the like; (meth)acrylic monomers such as acrylonitrile, methacrylonitrile, acrylamide, 2-acrylamido-2-methylpropane sulfonic acid and the like; and the like. One kind of these may be used singly, or two or more kinds thereof may be used in combination. Among these, an ethylenically unsaturated monomer or hypophosphorous acid or a salt thereof is preferable, a styrene-based monomer or a (meth)acrylic acid derivative is more preferable, and styrenesulfonic acid or 2-acrylamido-2-methylpropane sulfonic acid is still more preferable.

As the (co)polymer having a structural unit derived from a monomer having a carboxy group or a salt group thereof and a structural unit derived from another monomer, poly(meth)acrylic acid or a salt thereof, a copolymer of (meth)acrylic acid and styrenesulfonic acid or a salt thereof, or a copolymer composed of a reaction product of hypophosphorous acid or a salt thereof with (meth)acrylic acid and 2-(meth)acrylamido-2-methylpropanesulfonic acid or a salt thereof is preferable.

In addition, as the (co)polymer having a structural unit derived from a monomer having a carboxy group or a salt group thereof and a structural unit derived from another monomer, polyacrylic acid or a salt thereof, a copolymer of methacrylic acid and styrenesulfonic acid or a salt thereof, or a copolymer composed of a reaction product of hypophosphorous acid or a salt thereof with acrylic acid and 2-acrylamido-2-methylpropanesulfonic acid or a salt thereof is more preferable.

Moreover, as the (co)polymer having a structural unit derived from a monomer having a carboxy group or a salt group thereof and a structural unit derived from another monomer, polyacrylic acid or a salt thereof is still more preferable.

In the carboxy group-containing (co)polymer, the lower limit of the content proportion of the structural unit derived from a monomer having a carboxy group or a salt group thereof with respect to the total number of moles of the structural unit derived from a monomer having a carboxy group or a salt group thereof and other structural units is preferably 1 mol % or more, more preferably 10 mol % or more, more preferably 20 mol % or more, still more preferably 50 mol % or more, and particularly preferably 80 mol % or more (lower limit: 0 mol %). In addition, the upper limit of the content proportion of the structural unit derived from a monomer having a carboxy group or a salt group thereof with respect to the sum of the structural unit derived from a monomer having a carboxy group or a salt group thereof and other structural units is preferably 100 mol % or less (upper limit: 100 mol %). If the content proportion is in such a range, it is possible to more favorably exert the effects of the carboxy group-containing (co)polymer. Among these, a homopolymer having a structural unit derived from a monomer having a carboxy group or a salt group thereof is most preferable.

A part or whole of the structural unit derived from a monomer having a carboxy group or a salt group thereof may be a salt. Examples of the salt include alkali metal salts such as sodium salts, potassium salts and the like, salts of Group 2 elements such as calcium salts, magnesium salts and the like, amine salts, ammonium salts and the like. Among these, sodium salts are particularly preferable.

The lower limit of the weight average molecular weight of the carboxy group-containing (co)polymer is preferably 400 or more, more preferably 1,000 or more, and still more preferably 2,000 or more. The upper limit of the weight average molecular weight of the carboxy group-containing (co)polymer is preferably 2,000,000 or less and more preferably 1,000,000 or less. If the weight average molecular weight is in such a range, it is possible to more favorably exert the effects of the present invention. Incidentally, the weight average molecular weight of the carboxy group-containing (co)polymer can be measured by gel permeation chromatography (GPC). The details of the measurement method are described in Examples.

Incidentally, a commercially available product may be used as the carboxy group-containing (co)polymer. The commercially available product is not particularly limited, and examples thereof include Belclene (registered trademark) 500 or Belsperse (registered trademark) 164 manufactured by BWA Water Additives and the like as a copolymer composed of a reaction product of hypophosphorous acid or a salt thereof with acrylic acid and Belclene (registered trademark) 400 manufactured by BWA Water Additives and the like as a copolymer composed of a reaction product of hypophosphorous acid or a salt thereof with acrylic acid and 2-acrylamido-2-methylpropane sulfonic acid.

The lower limit of the content of the carboxy group-containing (co)polymer in the composition for surface treatment is preferably 0.0001 g/L or more, more preferably 0.001 g/L or more, still more preferably 0.1 g/L or more. If the content is this range, the effect of removing the organic compounds contained in the polishing composition and the organic compounds derived from pad waste and the like is further improved. In addition, the upper limit of the content of the carboxy group-containing (co)polymer in the composition for surface treatment is preferably 30 g/L or less, more preferably 10 g/L or less, and still more preferably 5 g/L or less. If the content is this range, the removal of the carboxy group-containing (co)polymer after the surface treatment is easier and it can be further suppressed that the carboxy group-containing (co)polymer itself after the surface treatment remains as an organic residue.

(Compound having partial structure represented by $SO_x$ or $NO_y$ (where x and y each independently denote a real number 1 to 5))

The composition for surface treatment according to an aspect of the present invention contains a compound ($SO_x$ or NO$_y$ partial structure-containing compound) having a partial structure represented by SO$_x$ or NO$_y$ (where x and y each independently denote a real number 1 to 5). The SO$_x$ or NO$_y$ partial structure-containing compound has an action of facilitating the removal of ceria residues.

In a mixture of two or more kinds of inorganic acids or salts thereof, sulfur oxides, or nitrogen oxides in which the kinds of constituent elements are the same as one another and only the valence or number of sulfur atoms (S) or nitrogen atoms (N), the number of hydrogen atoms (H), or the number of oxygen atoms (O) differ from one another, x and y denote average values. For example, an equimolar mixture (H$_2$SO$_{4.5}$) of peroxomonoulfuric acid (H$_2$SO$_5$)) with peroxodiulfuric acid (H$_2$S$_2$O$_8$) in which peroxomonosulfuric acid (H$_2$SO$_5$) is a compound having a partial structure in which x of SO$_x$ is 5 is handled as a compound having a partial structure in which x of SO$_x$ is 4.5.

Incidentally, the SO$_x$ or NO$_y$ partial structure-containing compound does not include the "carboxy group-containing (co)polymer" described above. In other words, in the present specification, in a case in which the (co)polymer having a structural unit derived from a monomer having a carboxy group or a salt group thereof has a partial structure represented by SO$_x$ or NO$_y$ (where x and y each independently denote a real number 1 to 5), this compound is handled as not the "SOx or NOy partial structure-containing compound" but as the "carboxy group-containing (co)polymer".

The SO$_x$ or NO$_y$ partial structure-containing compound is not particularly limited, and examples thereof include at least one kind of compound selected from the group consisting of sulfurous acid and salts thereof, sulfuric acid and salts thereof, persulfuric acid and salts thereof, sulfonic acid group-containing compounds (compounds having a sulfo group or a salt group thereof), nitrous acid and salts thereof, nitric acid and salts thereof, pernitric acid and salts thereof, nitro group-containing compounds (compounds having a nitro group), and the like.

The SO$_x$ or NO$_y$ partial structure-containing compound is not particularly limited, but particularly preferred examples thereof include at least one kind of compound selected from the group consisting of: a compound represented by the following Chemical Formula (1) and a salt thereof, a compound represented by the following Chemical Formula (2) and a salt thereof, a polymer composed of a structural unit represented by the following Chemical Formula (3) and a salt thereof, a copolymer having a structural unit represented by the following Chemical Formula (3) and a structural unit derived from another monomer and a salt thereof, and a compound represented by the following Chemical Formula (4), a salt thereof, and the like.

[Chem. 1]

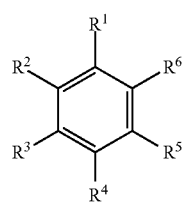

(1)

(in Formula (1), R$^1$ to R$^6$ each independently denote a hydrogen atom, a hydroxy group, a sulfo group, or an anionic group which does not have a sulfo group, a cationic group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms, and at this time, at least one of R$^1$ to R$^6$ denotes a sulfo group)

[Chem. 2]

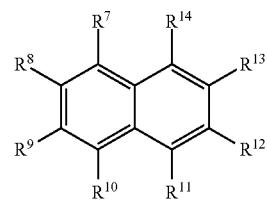

(2)

(in Formula (2), R$^7$ to R$^{14}$ each independently denote a hydrogen atom, a hydroxy group, a sulfo group, an anionic group which does not have a sulfo group, a cationic group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms, and at this time, at least one of R$^7$ to R$^{14}$ denotes a sulfo group).

[Chem. 3]

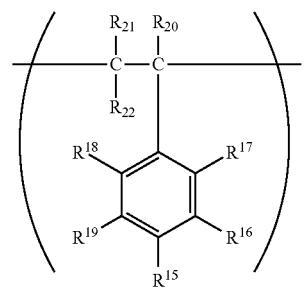

(3)

(In Formula (3), R$^{15}$ to R$^{19}$ each independently denote a hydrogen atom, a hydroxy group, a sulfo group, a phosphoric acid group, a cationic group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms, at this time, at least one of R$^{15}$ to R$^{19}$ denotes a sulfo group, R$^{20}$ to R$^{22}$ each independently denote a hydrogen atom, a hydroxy group, a phosphoric acid group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms which is not substituted or may be substituted with a hydroxy group, a phosphoric acid group, a cationic group, or an alkoxycarbonyl group having 2 to 11 (preferably 2 to 9, and more preferably 2 to 6) carbon atoms).

[Chem. 4]

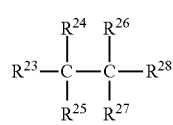

(4)

(In Formula (4), $R^{23}$ to $R^{28}$ each independently denote a hydrogen atom, a hydroxy group, a sulfo group, an anionic group which does not have a sulfo group, a cationic group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms, and at this time, at least one of $R^{23}$ to $R^{28}$ denotes a sulfo group).

In the present specification, an anionic group means a functional group in which a counter ion is dissociated to become an anion and a cationic group means a functional group in which a counter ion is dissociated or bonded to a cationic species generated by ionization of another ionic compound and thus becomes a cation.

The compound represented by Chemical Formula (1) above or a salt thereof is preferably a compound represented by Formula (1) in which $R^1$ denotes a sulfo group and $R^2$ to $R^6$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, or a salt thereof.

In addition, the compound represented by Chemical Formula (1) above or a salt thereof is more preferably a compound represented by Formula (1) in which $R^1$ denotes a sulfo group and $R^2$ to $R^6$ each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, or a salt thereof.

Moreover, the compound represented by Chemical Formula (1) above or a salt thereof is still more preferably a compound represented by Formula (1) in which $R^1$ denotes a sulfo group and $R^2$ to $R^6$ each independently denote a hydrogen atom, an amino group, or a hydrocarbon group having 1 to 10 carbon atoms, or a salt thereof.

The compound represented by Chemical Formula (2) above or a salt thereof is preferably a compound represented by Formula (2) in which one of $R^7$ or $R^8$ denotes a sulfo group, the other of $R^7$ or $R^8$ denotes a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, and $R^9$ to $R^{14}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, or a salt thereof.

In addition, the compound represented by Chemical Formula (2) above or a salt thereof is preferably a compound represented by Formula (2) in which one of $R^7$ or $R^8$ denotes a sulfo group, the other of $R^7$ or $R^8$ denotes a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, and $R^9$ to $R^{14}$ each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, or a salt thereof.

Moreover, the compound represented by Chemical Formula (2) above or a salt thereof is still more preferably a compound represented by Formula (2) in which one of $R^7$ or $R^8$ denotes a sulfo group, the other of $R^7$ or $R^8$ denotes a hydrogen atom, and $R^9$ to $R^{14}$ each independently denote a hydrogen atom or a hydroxy group, or a salt thereof.

The polymer composed of a structural unit represented by Chemical Formula (3) above or a salt thereof and the copolymer having a structural unit represented by Chemical Formula (3) above and a structural unit derived from another monomer or a salt thereof are each preferably a polymer composed of a structural unit represented by the following Chemical Formula (5) or a salt thereof and a copolymer having a structural unit represented by following Chemical formula (5) and a structural unit derived from another monomer or a salt thereof.

[Chem. 5]

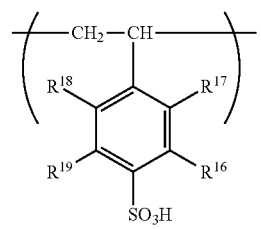

(5)

(In Formula (5), $R^{16}$ to $R^{19}$ each independently denote a hydrogen atom, a hydroxy group, a phosphoric acid group, a cationic group, an alkoxycarbonyl group having 2 to 11 (preferably 2 to 9, and more preferably 2 to 6) carbon atoms, or a hydrocarbon group having 1 to 20 (preferably 1 to 12, and more preferably 1 to 10) carbon atoms).

In addition, it is more preferable that $R^{16}$ to $R^{19}$ in Formula (5) above each independently denote a hydrogen atom, a hydroxy group, a phosphoric acid group, an amino group, an alkoxycarbonyl group having 2 to 6 carbon atoms, or a hydrocarbon group having 1 to 10 carbon atoms.

The compound represented by Chemical Formula (4) above or a salt thereof is preferably a compound represented by Formula (4) in which $R^{23}$ denotes a sulfo group and $R^{24}$ to $R^{28}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, or a salt thereof.

In addition, the compound represented by Chemical Formula (4) above or a salt thereof is preferably a compound represented by Formula (4) in which $R^{23}$ denotes a sulfo group and $R^{24}$ to $R^{28}$ each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, or a salt thereof.

Moreover, the compound represented by Chemical Formula (4) above or a salt thereof is still more preferably a compound represented by Formula (4) in which $R^{23}$ denotes a sulfo group, $R^{24}$ to $R^{27}$ denote a hydrogen atom, and $R^{28}$ denotes a hydroxy group, or a salt thereof.

In Formulas (1) to (5) above, the amino group represents a —$NH_2$ group, a —NHR group, or a —NRR' group (R and R' denote a substituent) but a —$NH_2$ group is preferable among these. In addition, as the alkoxycarbonyl group having 2 to 6 carbon atoms, a methoxycarbonyl group, an ethoxycarbonyl group, an n-propyloxycarbonyl group, an isopropyloxycarbonyl group, an n-butoxycarbonyl group, a sec-butoxycarbonyl group, and a tert-butoxycarbonyl group are preferable and a methoxycarbonyl group is more preferable. Moreover, as the hydrocarbon group having 1 to 10 carbon atoms, a methyl group, an ethyl group, a n-propyl group, an isopropyl group, a n-butyl group, a sec-butyl group, and a tert-butyl group is preferable and a methyl group is more preferable.

The main chain of the copolymer having a structural unit represented by Chemical Formula (3) above and a structural unit derived from another monomer or a salt thereof may be composed only of carbon atoms or oxygen atoms and nitrogen atoms may be contained at a part of the main chain in addition to carbon atoms.

The structural unit derived from another monomer in the copolymer having a structural unit represented by Chemical Formula (3) above and a structural unit derived from another monomer or a salt thereof is not particularly limited, and known ones can be used. Examples of such another monomer include ethylenically unsaturated monomers, diamines, diepoxides and the like. One kind of these may be used singly, or two or more kinds thereof may be used in combination.

In the polymer composed of a structural unit represented by Chemical Formula (3) above or a salt thereof or the copolymer having a structural unit represented by Chemical Formula (3) above and a structural unit derived from another monomer or a salt thereof, the lower limit of the content proportion of the structural unit represented by Chemical Formula (3) above to the total number of moles of the structural unit represented by Chemical Formula (3) above and the structural unit derived from another monomer is preferably 1 mol % or more (lower limit: 0 mol %). In addition, the upper limit of the content proportion of the structural unit represented by Chemical Formula (3) above to the total number of moles of the structural unit represented by Chemical Formula (3) above and the structural unit derived from another monomer is preferably 100 mol % or less (upper limit: 100 mol %).

The lower limit of the weight average molecular weight of the polymer composed of a structural unit represented by Chemical Formula (3) above or a salt thereof or the copolymer having a structural unit represented by Chemical Formula (3) above and a structural unit derived from another monomer or a salt thereof is preferably 1,000 or more. In addition, the upper limit of the weight average molecular weight of the polymer composed of a structural unit represented by Chemical Formula (3) above or a salt thereof or the copolymer having a structural unit represented by Chemical Formula (3) above and a structural unit derived from another monomer or a salt thereof is preferably 1,000,000 or less. Incidentally, the weight average molecular weight of the polymer composed of a structural unit represented by Chemical Formula (3) above or a salt thereof or the copolymer having a structural unit represented by Chemical Formula (3) above and a structural unit derived from another monomer or a salt thereof can be measured by gel permeation chromatography (GPC).

The nitro group-containing compound is not particularly limited, but examples thereof include 2-hydroxymethyl-2-nitro-1,3-propanediol, 4,6-dinitroresorcinol, 2-nitro-p-xylylene glycol and the like.

The upper limit of the molecular weight of the $SO_x$ or $NO_y$ partial structure-containing compound is particularly preferably less than 1,000.

It is preferable that the $SO_x$ or $NO_y$ partial structure-containing compound is at least one kind of compound selected from the group consisting of a sulfite, a sulfate, a persulfate, a sulfonic acid group-containing compound, a nitrite, a nitrate, a pernitrate, and a nitro group-containing compound or a hydrate thereof.

Here, it is more preferable that the $SO_x$ or $NO_y$ partial structure-containing compound is at least one kind of compound selected from the group consisting of a sulfate, a sulfonic acid group-containing compound, a nitrate, and a nitro group-containing compound.

In addition, it is still more preferable that the $SO_x$ or $NO_y$ partial structure-containing compound is at least one kind of compound selected from the group consisting of a sulfate, isethionic acid and a salt thereof, m-xylenesulfonic acid and a salt thereof, 1-naphthalenesulfonic acid and a salt thereof, 2-naphthol-6-sulfonic acid and a salt thereof, p-toluidine-2-sulfonic acid and a salt thereof, benzenesulfonic acid and a salt thereof, dodecylbenzenesulfonic acid and a salt thereof, di(2-ethylhexyl)sulfosuccinic acid and a salt thereof, a nitrate, and 2-hydroxymethyl-2-nitro-1,3-propanediol.

Moreover, it is particularly preferable that the $SO_x$ or $NO_y$ partial structure-containing compound is at least one kind of compound selected from the group consisting of a sulfate, isethionic acid and a salt thereof, m-xylenesulfonic acid and a salt thereof, 1-naphthalenesulfonic acid and a salt thereof, and 2-naphthol-6-sulfonic acid and a salt thereof.

The $SO_x$ or $NO_y$ partial structure-containing compound may be in the form of a salt (including partial salt). Examples of the salt include alkali metal salts such as sodium salts, potassium salts and the like, salts of Group 2 elements such as calcium salts, magnesium salts and the like, amine salts, ammonium salts and the like. Among these, sodium salts or ammonium salts are preferable. Here, as the organic salt, sodium salts are more preferable and sodium salts of compounds represented by General Formulas (1) to (4) above are more preferable. In addition, as the inorganic salt, ammonium salts are preferable, ammonium sulfate or ammonium nitrate is more preferable, and ammonium sulfate is still more preferable.

The $SO_x$ or $NO_y$ partial structure-containing compound according to an aspect of the present invention may be in a form of the $SO_x$ or $NO_y$ partial structure-containing compound itself or may be in the form of a hydrate thereof.

The lower limit of the content of the $SO_x$ or $NO_y$ partial structure-containing compound in the composition for surface treatment is preferably 0.01 g/L or more, more preferably 0.1 g/L or more, and still more preferably 0.6 g/L or more. If the content is in this range, the effect of removing ceria residues such as the abrasive grains contained in the polishing composition and the like is further improved. In addition, the upper limit of the content of the $SO_x$ or $NO_y$ partial structure-containing compound in the composition for surface treatment is preferably 100 g/L or less, more preferably 10 g/L or less, and still more preferably 5 g/L or less. If the content is in this range, the removal of the $SO_x$ or $NO_y$ partial structure-containing compound becomes easier and it is further suppressed that the $SO_x$ or $NO_y$ partial structure-containing compound itself after the surface treatment remains as a defect.

Incidentally, in the case of mixing the $SO_x$ or $NO_y$ partial structure-containing compound in the state of a hydrate at the time of mixing of the $SO_x$ or $NO_y$ partial structure-containing compound at the time of production of the polishing composition, the preferred content of the $SO_x$ or $NO_y$ partial structure-containing compound in the polishing composition indicates the content calculated from the mass excluding the hydrated water.

(Abrasive Grain)

It is preferable that the composition for surface treatment according to an aspect of the present invention further contains an abrasive grain. Abrasive grains have an action of mechanically washing the object to be subjected to surface treatment and further improve the effect of removing the particle residues and the organic residues by the composition for surface treatment.

The lower limit value of the average primary particle size of abrasive grains in the composition for surface treatment is preferably 5 nm or more. If the average primary particle size is in this range, the energy for defect removal by the abrasive grains is further improved and the effect of removing the particle residues and the organic residues by the composition for surface treatment is also further improved. For this reason, the lower limit value of the average primary particle size of abrasive grains in the composition for surface treatment is more preferably 7 nm or more and still more preferably 10 nm or more. In addition, the upper limit value of the average primary particle size of abrasive grains in the composition for surface treatment is preferably 50 nm or less. If the average primary particle size is in this range, the contact area between the abrasive grains and the composition for surface treatment further increases and the effect of removing the particle residues and the organic residues by the composition for surface treatment is also further improved. For this reason, the upper limit value of the average primary particle size of abrasive grains in the composition for surface treatment is more preferably 45 nm or less and still more preferably 40 nm or less. Incidentally, the value of the average primary particle size of abrasive grains is calculated, for example, based on the specific surface area of abrasive grains measured by a BET method.

The average secondary particle size of abrasive grains in the composition for surface treatment is preferably 5 nm or more, more preferably 10 nm or more, still more preferably 15 nm or more, and particularly preferably 20 nm or more. As the average secondary particle size of abrasive grains increases, the energy for defect removal by the abrasive grains is further improved and the washing effect by the composition for surface treatment is further improved. The average secondary particle size of abrasive grains in the composition for surface treatment is preferably 100 nm or less, more preferably 90 nm or less, and still more preferably 80 nm or less. As the average secondary particle size of abrasive grains decreases, the contact area between the abrasive grains and the composition for surface treatment further increases and the washing effect by the composition for surface treatment is further improved. Incidentally, the value of the average secondary particle size of abrasive grains is calculated, for example, based on the specific surface area of abrasive grains measured by a light scattering method using a laser beam.

The abrasive grain is not particularly limited as long as it is other than one containing ceria and may be any of inorganic particles, organic particles, or organic-inorganic composite particles. Examples of the inorganic particles include particles formed of metal oxides such as silica, alumina, titania and the like, silicon nitride particles, silicon carbide particles, and boron nitride particles. Specific examples of the organic particles include polymethyl methacrylate (PMMA) particles. Among these, silica is preferable and colloidal silica is more preferable from the viewpoint of easy availability and the cost. Incidentally, one kind of these abrasive grains may be used singly or two or more kinds thereof may be used in combination. In addition, as the abrasive grain, a commercially available product may be used or a synthetic product may be used.

The abrasive grains may be subjected to surface modification. The value of zeta potential of ordinary colloidal silica is close to zero under acidic conditions and thus the silica particles do not electrically repel each other under acidic conditions and are likely to be aggregated. In contrast, abrasive grains which have been subjected to surface modification so that the zeta potential thereof has a relatively large negative value even under acidic conditions strongly repel each other even under acidic conditions and are favorably dispersed, and as a result, the polishing speed and storage stability of the composition for surface treatment can be further improved. Among these, particularly preferred one is silica (organic acid-modified silica) in which an organic acid is immobilized on the surface.

Silica in which an organic acid is immobilized on the surface include fumed silica, colloidal silica and the like, and colloidal silica is particularly preferable. The organic acid is not particularly limited, and examples thereof include sulfonic acid, carboxylic acid, phosphoric acid and the like, and sulfonic acid or carboxylic acid is preferable. Incidentally, an acidic group (for example, a sulfo group, a carboxy group, a phosphoric acid group or the like) derived from the organic acid is immobilized on the surface of the silica which is contained in the composition for surface treatment of the present invention and in which an organic acid is immobilized on the surface by a covalent bond (via a linker structure in some cases).

The method for introducing these organic acids into the silica surface is not particularly limited, but examples thereof include a method in which an acidic group derived from the organic acid is introduced into the silica surface in a state in which a protecting group is bonded to the acidic group and then the protecting group is eliminated in addition to a method in which an acid group is introduced into the silica surface in the state of a mercapto group, an alkyl group, or the like and then oxidized into a sulfonic acid or a carboxylic acid. In addition, the compound to be used when an organic acid is introduced into the silica surface is not particularly limited, but it is preferable to have at least one functional group which can be an organic acid group and to further have a functional group to be used in bonding with the hydroxyl group on the silica surface, a functional group to be introduced in order to control the hydrophobicity/hydrophilicity, a functional group to be introduced in order to control the steric bulk and the like.

As a specific synthetic method of silica in which an organic acid is immobilized on the surface, synthesis can be performed by the method described in, for example, "Sulfonic acid-functionalized silica through quantitative oxidation of thiol groups", Chem. Commun. 246-247 (2003) if sulfonic acid which is a kind of organic acid is immobilized on the surface of silica. Specifically, it is possible to obtain silica in which sulfonic acid is immobilized on the surface by coupling a silane coupling agent having a thiol group such as 3-mercaptopropyltrimethoxysilane or the like with silica and then oxidizing the thiol group with hydrogen peroxide. Alternatively, synthesis can be performed by the method described in, for example, "Novel Silane Coupling Agents Containing a Photolabile 2-Nitrobenzyl Ester for Introduction of a Carboxy Group on the Surface of Silica Gel", Chemistry Letters, 3, 228-229 (2000) if a carboxylic acid is immobilized on the surface of silica. Specifically, it is possible to obtain silica in which a carboxylic acid is immobilized on the surface by coupling a silane coupling agent containing a photoreactive 2-nitrobenzyl ester with silica and then performing photoirradiation.

Incidentally, silica in which an organic acid is not immobilized on the surface may be concurrently used in the case of using silica in which an organic acid is immobilized on the surface as abrasive grains. However, the content proportion of the silica in which an organic acid is immobilized on the surface in the entire abrasive grains is preferably 50 mass % or more, more preferably 80 mass % or more, still more preferably 90 mass % or more, particularly preferably 95 mass % or more, and most preferably 100 mass % on a mass basis.

In the case of containing abrasive grains in the composition for surface treatment, the lower limit value of the content of abrasive grains in the composition for surface treatment is preferably 0.01 g/L or more, more preferably 0.1 g/L or more, and still more preferably 0.5 g/L or more. As the content of abrasive grains increases, the effect of removing the particle residues and organic residues of the object to be polished by the composition for surface treatment is further improved. The content of abrasive grains in the composition for surface treatment is preferably 10 g/L or less, more preferably 5 g/L or less, still more preferably 2 g/L or less, and particularly preferably 1.5 g/L or less. As the content of abrasive grains decreases, the number of particle residues which are not derived from ceria and the number of other residues further decrease.

(Wetting Agent)

It is preferable that the composition for surface treatment according to an aspect of the present invention further contains a wetting agent. The wetting agent improves the effect of removing the organic residues by the composition for surface treatment. It is presumed that this effect is derived from the action of enhancing the potential repulsion between the organic residues and the object to be subjected to surface treatment as the surface of the object to be subjected to surface treatment is covered with a wetting agent, but this mechanism is based on presumption, and an aspect of the present invention is not limited to the above mechanism at all.

The wetting agent is not particularly limited, but examples thereof include polysaccharides, (co)polymers of N-vinyl compounds, hydroxy group-containing (co)polymers and the like.

In addition, the above-described "carboxy group-containing (co)polymer" and the above-described "$SO_x$ or $NO_y$ partial structure-containing compound" are not included in the wetting agent.

Among these, preferred examples of the wetting agent include polysaccharides, polyvinyl alcohol and derivatives thereof, polyvinyl pyrrolidone and derivatives thereof, and the like.

A polysaccharide refers to a saccharide in which a large number of monosaccharide molecules are polymerized by a glycosidic bond. The polysaccharide is not particularly limited as long as it satisfies the above definition, and examples thereof include polysaccharides such as cellulose derivatives and starch derivatives. Cellulose derivatives are polymers having a β-glucose unit as the main repeating unit. Specific examples of the cellulose derivative include hydroxyethyl cellulose (HEC), hydroxypropyl cellulose, hydroxyethyl methyl cellulose, hydroxypropyl methyl cellulose, methyl cellulose, ethyl cellulose, ethyl hydroxyethyl cellulose and the like. Starch derivatives are polymers having an α-glucose unit as the main repeating unit. Specific examples of the starch derivative include pregelatinized starch, pullulan, cyclodextrin and the like.

The polyvinyl alcohol and derivatives thereof are not particularly limited as long as these are polymers having a constituent unit derived from vinyl alcohol as a main component, and examples thereof include common polyvinyl alcohol; derivatives of polyvinyl alcohol such as modified polyvinyl alcohol.

Examples of the modified vinyl alcohol include polyvinyl alcohol modified with a water-soluble group such as an acetoacetyl group, an acetyl group, an ethylene oxide group and the like; a butenediol/vinyl alcohol copolymer and the like.

Polyvinyl pyrrolidone and derivatives thereof are not particularly limited as long as these are polymers having a constituent unit derived from vinyl pyrrolidone as a main component, and examples thereof include polyvinyl pyrrolidone; derivatives of polyvinyl pyrrolidone such as polyvinyl alcohol-based graft polymers and the like such as a polyvinyl pyrrolidone/polyvinyl alcohol copolymer and the like.

Incidentally, the wetting agent may be a copolymer having both a polyvinyl alcohol skeleton and a polyvinyl pyrrolidone skeleton.

Among these wetting agents, polyvinyl alcohol or polyvinyl pyrrolidone is particularly preferable and polyvinyl pyrrolidone is most preferable.

The lower limit value of the weight average molecular weight of the wetting agent is not particularly limited but is, for example, preferably 1,000 or more, more preferably 8,000 or more, and still more preferably 10,000 or more. As the value of the weight average molecular weight of the wetting agent increases, the effect of removing the organic residues derived from the organic compounds contained in the polishing composition, pad waste and the like is further improved. In addition, the upper limit value of the weight average molecular weight of the wetting agent is preferably 1,000,000 or less, more preferably 100,000 or less, and still more preferably 50,000 or less. As the value of the weight average molecular weight of the wetting agent decreases, the removal of the wetting agent after the surface treatment is easier and it is further suppressed that the wetting agent itself remains as an organic residue. The weight average molecular weight of the wetting agent can be measured by gel permeation chromatography (GPC).

As the wetting agent, a commercially available product may be used. The commercially available product is not particularly limited, but examples thereof include K30 manufactured by Tokyo Chemical Industry Co., Ltd or the like.

These wetting agents may be used singly or two or more kinds thereof may be used in mixture.

The lower limit of the content of the wetting agent in the composition for surface treatment is preferably 0.01 g/L or more, more preferably 0.1 g/L or more, and still more preferably 0.5 g/L or more. In addition, the upper limit of the content of the wetting agent in the composition for surface treatment is preferably 50 g/L or less, more preferably 10 g/L or less, and still more preferably 5 g/L or less. If the content is in such a range, it is possible to more favorably exert the effects of the wetting agent.

(pH Adjusting Agent)

It is preferable that the composition for surface treatment according to an aspect of the present invention further contains a pH adjusting agent in order to adjust the pH to a desired pH value.

Incidentally, in the present specification, the "carboxy group-containing (co)polymer" and the "$SO_x$ or $NO_y$ partial structure-containing compound" described above are handled as those that are not included in the pH adjusting agent.

The pH adjusting agent is not particularly limited, and known pH adjusting agents used in the field of composition for surface treatment can be used. Among these, known acids, bases, salts, amines, chelating agents and the like are preferably used. Examples of the pH adjusting agent include carboxylic acids such as formic acid, acetic acid, propionic acid, butyric acid, valeric acid, caproic acid, enantoic acid, caprylic acid, perargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acids, anthranilic acid, nitrocarboxylic acid and the like; inorganic acids such as carbonic acid, hydrochloric acid, phosphoric acid, hypophosphorous acid, phosphorous acid, phosphoric acid, boric acid, hydrofluoric acid, orthophosphoric acid, pyrophosphoric acid, polyphosphoric acid, metaphosphoric acid, hexametaphosphoric acid and the like; hydroxides of alkali metals such as potassium hydroxide (KOH) and the like; hydroxides of Group 2 elements; ammonia (ammonium hydroxide); organic bases such as quaternary ammonium hydroxide and the like; amines such as aliphatic amines, aromatic amines and the like; chelating agents such as iminodiacetic acid (iminodiacetic acid), nitrilotriacetic acid, diethylenetriaminepentaacetic acid, ethylenediaminetetraacetic acid, N,N,N-trimethylenephosphonic acid, trans cyclohexane diamine tetraacetic acid, 1,2-diaminopropane tetraacetic acid, glycol ether diamine tetraacetic acid, ethylene diamine orthohydroxyphenyl acetic acid, ethylene diamine disuccinic acid (SS form), N-(2-carboxylate ethyl)-L-aspartic acid, β-alanine diacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, polyamine, polyphosphonic acid, polyaminocarboxylic acid, polyaminophosphonic acid and the like, and the like. These pH adjusting agents may be used singly or two or more kinds thereof may be used in combination.

Among these pH adjusting agents, ammonia, potassium hydroxide, acetic acid, citric acid, malonic acid, iminodiacetic acid, or maleic acid is preferable and a combination of ammonia, quaternary ammonium hydroxide or potassium hydroxide with acetic acid, citric acid, malonic acid, iminodiacetic acid or maleic acid is more preferable.

As the content of the pH adjusting agent in the composition for surface treatment, an amount may be appropriately selected so as to have a desired pH value of the composition for surface treatment and it is preferable to add the pH adjusting agent in an amount so as to have a preferred pH value of the composition for surface treatment to be described later.

(Other Additives)

The composition for surface treatment according to an aspect of the present invention may contain other additives at arbitrary proportions if necessary as long as the effects of the present invention are not impaired. However, it is desirable not to add components other than the essential components of the composition for surface treatment according to an aspect of the present invention as far as possible since these may be the causes of defects, thus it is preferable that the added amount thereof is as small as possible and it is more preferable not to contain other additives. Examples of other additives include an antiseptic agent, a dissolved gas, a reducing agent, an oxidizing agent, an alkanolamine and the like.

(Dispersing Medium)

The composition for surface treatment according to an aspect of the present invention contains a dispersing medium (solvent). The dispersing medium has a function of dispersing or dissolving the respective components. The dispersing medium is not particularly limited, and known solvents can be used. Among these, the dispersing medium preferably contains water and is more preferably only water. In addition, the dispersing medium may be a mixed solvent of water and an organic solvent for dispersion or dissolution of the respective components. In this case, examples of the organic solvent used include acetone, acetonitrile, ethanol, methanol, isopropanol, glycerin, ethylene glycol, propylene glycol and the like that are an organic solvent miscible with water. In addition, these organic solvents may be used without being mixed with water, the respective components may be dispersed or dissolved in these organic solvents, and then the dispersions or solutions are mixed with water. These organic solvents may be used singly or two or more kinds thereof may be used in combination.

Water is preferably water which does not contain impurities as little as possible from the viewpoint of inhibiting the contamination of the object to be subjected to surface treatment and the action of other components. For example, water in which the total content of transition metal ions is 100 ppb or less is preferable. Here, the purity of water can be increased by, for example, operations such as removal of impurity ions using an ion exchange resin, removal of foreign matters using a filter, distillation and the like. Specifically, as water, it is preferable to use, for example, deionized water (ion-exchanged water), pure water, ultrapure water, distilled water and the like.

(pH Value)

The pH of the composition for surface treatment according to an aspect of the present invention is 1 or more and 8 or less. When the pH of the composition for surface treatment is less than 1, the possibility of deteriorating the polishing apparatus and the consumable members such as the polishing pad in contact increases. Furthermore, the product materials generated by the deterioration increase the possibility of generation of residues and generation of scratches and the like. For this reason, the lower limit of the pH of the composition for surface treatment is 1 or more, preferably 2 or more, and more preferably 3 or more. In addition, when the pH value of the composition for surface treatment is more than 8, the effects of the present invention are not exerted and it is not possible to favorably remove the ceria residues such as abrasive grains contained in the polishing composition, the organic residues derived from the organic compounds contained in the polishing composition, pad waste and the like. For this reason, the upper limit of the pH of the composition for surface treatment is 8 or less, preferably 7 or less, and more preferably 6 or less. Incidentally, the pH value of the composition for surface treatment can be confirmed using a pH meter (trade name: LAQUA (registered trademark) manufactured by HORIBA, Ltd.).

(Object to be Subjected to Surface Treatment)

The object to be subjected to surface treatment is preferably a polished object to be polished obtained after being polished using a polishing composition containing ceria. The polished object to be polished means an object to be polished after being polished in the polishing step. The polishing step is not particularly limited but is preferably a CMP step.

The polished object to be polished is preferably a polished semiconductor substrate and more preferably a semiconductor substrate after being subjected to CMP. Here, defects, particularly ceria residues and organic residues can be a cause of a decrease in the performance of the semiconductor device. Hence, in a case in which the polished object to be polished is a polished semiconductor substrate, it is desirable to decrease the ceria residues and the organic residues as much as possible in the surface treatment step of the semiconductor substrate. The composition for surface treatment according to an aspect of the present invention has a sufficient effect of removing these and thus can be suitably used in the surface treatment (for example, washing treatment, a rinse polishing treatment or the like to be described later) of such a polished semiconductor substrate.

The composition for surface treatment according to an aspect of the present invention is not particularly limited but is preferably applied to a polished object to be polished which contains silicon nitride, silicon oxide, or polysilicon and still more preferably applied to a polished object to be polished which contains silicon nitride since the effects of the present invention are more favorably exerted.

Examples of the polished object to be polished which contains silicon nitride, silicon oxide, or polysilicon include a polished object to be polished which is composed of a simple substance of each of silicon nitride, silicon oxide, or polysilicon, a polished object to be polished in a state in which materials other than silicon nitride, silicon oxide, or polysilicon are exposed on the surface, and the like in addition to these. Here, examples of the former include a silicon nitride substrate, a silicon oxide substrate, or a polysilicon substrate which is a semiconductor substrate, a substrate in which a silicon nitride film, a silicon oxide film or a polysilicon film is formed on the outermost surface, and the like. In addition, with regard to the latter, materials other than silicon nitride, silicon oxide, or polysilicon are not particularly limited, but examples thereof include tungsten and the like, specific examples include a polished semiconductor substrate having a structure in which a silicon nitride film or a silicon oxide film is formed on tungsten, a polished semiconductor substrate having a structure in which a tungsten portion, a silicon nitride film, and a silicon oxide film are exposed on the outermost surface, and the like.

Incidentally, examples of the polished object to be polished which contains silicon oxide include a TEOS type silicon oxide film (hereinafter, also simply referred to as "TEOS") formed using tetraethyl ortho-silicate as a precursor, an HDP film, a USG film, a PSG film, a BPSG film, an RTO film and the like.

<Method for Producing Composition for Surface treatment>

Another aspect of the present invention is a method for producing the composition for surface treatment described above, which includes mixing a carboxy group-containing (co)polymer, a $SO_x$ or $NO_y$ partial structure-containing compound, and a dispersing medium. In the method for producing a composition for surface treatment according to an aspect of the present invention, the abrasive grains described above, a hydrophilizing agent, a wetting agent, a pH adjusting agent, other additives and the like may be further mixed. The details of the various kinds of additives to be added are as described above.

In the present specification, the mixing of the $SO_x$ or $NO_y$ partial structure-containing compound also includes mixing in the state of hydrates of these in addition to mixing in the state of the $SO_x$ or $NO_y$ partial structure-containing compound itself.

The mixing method such as the mixing conditions and mixing order of these is not particularly limited, and known ones can be used.

Incidentally, in the case of using a pH adjusting agent, the step of adding the pH adjusting agent can be "adjustment of the pH to 1 or more and 8 or less" in the production method according to an aspect of the present invention. In addition, adjustment to other preferred pH ranges is also the same. However, the method for adjusting the pH is not limited to this.

The temperature when the respective components are mixed together is not particularly limited but is preferably 10° C. to 40° C., and heating may be performed in order to increase the rate of dissolution.

<Surface Treatment Method>

(Surface Treatment)

Another aspect of the present invention is a surface treatment method which includes performing a surface treatment of an object to be subjected to surface treatment (polished object to be polished) using the composition for surface treatment. In the present specification, the surface treatment method refers to a method for decreasing defects on the surface of an object to be subjected to surface treatment and is a method for performing washing in a broad sense.

According to the surface treatment method according to an aspect of the present invention, it is possible to easily remove the ceria residues and the organic residues on the polished object to be polished obtained after being polished using a polishing composition containing ceria. In other words, according to another aspect of the present invention, there is provided a method for decreasing the ceria residues and organic residues on the surface of a polished object to be polished obtained after being polished using a polishing composition containing ceria, which includes performing a surface treatment of the polished object to be polished using the composition for surface treatment.

The surface treatment method according to an aspect of the present invention is performed by a method in which the composition for surface treatment according to the present invention is brought into direct contact with the object to be subjected to surface treatment.

Examples of the surface treatment method mainly include (I) a method by a rinse polishing treatment and (II) a method by a washing treatment. In other words, the surface treatment according to an aspect of the present invention is preferably performed by rinse polishing or washing. The rinse polishing treatment and the washing treatment are performed in order to remove defects on the surface of an object to be subjected to surface treatment, particularly ceria residues (particularly particle residues derived from ceria) and organic residues and to obtain a clean surface. The (I) and (II) above will be described below.

(I) Rinse Polishing Treatment

The composition for surface treatment according to an aspect of the present invention is suitably used in the rinse polishing treatment. In other words, the composition for surface treatment according to an aspect of the present invention can be preferably used as a composition for rinse polishing. The rinse polishing treatment is preferably performed on a polishing table (platen) to which a polishing pad is attached after the final polishing (finish polishing) of the object to be polished is performed for the purpose of removing defects on the surface of a polished object to be polished. At this time, the rinse polishing treatment is performed by bringing the composition for rinse polishing into direct contact with the object to be subjected to surface treatment. As a result, defects on the surface of the object to be subjected to surface treatment are removed by the frictional force (physical action) by the polishing pad and the chemical action by the composition for rinse polishing. Among the defects, particularly particle residues and organic residues are likely to be removed by physical action. Hence, in the rinse polishing treatment, the particle residues and the organic residues can be effectively removed by utilizing the friction with the polishing pad on the polishing table (platen).

Specifically, the rinse polishing treatment can be performed by placing the surface after being subjected to the polishing step on the polishing table (platen) of a polishing apparatus, bringing the polishing pad and the object to be subjected to surface treatment into contact with each other, and relatively sliding the object to be subjected to surface treatment and the polishing pad while supplying the composition for rinse polishing to the contact portion.

As the polishing apparatus, it is possible to use a general polishing apparatus to which a holder for holding the object to be polished, a motor capable of changing the revolution number, and the like are attached and which has a polishing table to which a polishing pad (polishing cloth) can be attached.

The rinse polishing treatment can be performed using either of a single-side polishing apparatus or a double-side polishing apparatus. Moreover, it is preferable that the above-described polishing apparatus is equipped with a discharge nozzle for the composition for rinse polishing in addition to a discharge nozzle for the polishing composition. Specifically, as the polishing apparatus, for example, a washing apparatus-integrated polishing apparatus MirraMesa (registered trademark) manufactured by Applied Materials, Inc. and the like can be preferably used.

As the polishing pad, general non-woven fabric, polyurethane, porous fluororesin and the like can be used without particular limitation. It is preferable that the polishing pad has been subjected to grooving so as to retain the composition for rinse polishing.

The rinse polishing conditions are not particularly limited, and, for example, the revolution number of the polishing table and the revolution number of the head (carrier) are preferably 10 rpm or more and 100 rpm or less and the pressure (polishing pressure) applied to the object to be polished is preferably 0.5 psi or more and 10 psi or less. The method for supplying the composition for rinse polishing to the polishing pad is not particularly limited, and, for example, a method (free-flowing) in which the composition for rinse polishing is continuously supplied to the polishing pad using a pump or the like is employed. There is no limitation on this supplied amount, but it is preferable that the surface of the polishing pad is always covered with the composition for rinse polishing and the supplied amount is preferably 10 mL/min or more and 5000 mL/min or less. The polishing time is also not particularly limited but is preferably 5 seconds or more and 180 seconds or less in the step using the composition for rinse polishing.

As the rinse polishing treatment, it is preferable that the rinse polishing treatment is performed using water (preferably deionized water) as a composition for rinse polishing under the same conditions as those in the rinse polishing treatment as the surface treatment method described above and then the rinse polishing treatment is performed using the composition for surface treatment according to an aspect of the present invention as a composition for rinse polishing under the above-described rinse polishing treatment conditions. Here, with regard to the rinse polishing treatment using water and the rinse polishing treatment using the composition for surface treatment according to an aspect of the present invention, the rinse polishing treatments may be performed using the same polishing table or the rinse polishing treatments may be performed using different polishing tables. Incidentally, in a case in which the rinse polishing treatment using water and the rinse polishing treatment using the composition for surface treatment according to an aspect of the present invention are performed using the same polishing table, it is preferable to perform pad conditioning with pure water for 5 seconds or more in order to remove the composition for rinse polishing and to wash the top of the polishing pad before the next polishing is performed.

After the rinse polishing treatment using the composition for surface treatment according to an aspect of the present invention, it is preferable that the object to be subjected to surface treatment is pulled up while applying the composition for surface treatment according to an aspect of the present invention thereonto and taken out.

(II) Washing Treatment

The composition for surface treatment according to an aspect of the present invention is suitably used in the washing treatment. In other words, the composition for surface treatment according to an aspect of the present invention can be preferably used as a washing composition. The washing treatment is performed, after final polishing (finish polishing) of the object to be polished has been performed or after the rinse polishing treatment using a composition for surface treatment according to an aspect of the present invention or another composition for rinse polishing, for the purpose of removing defects on the surface of the polished object to be polished. Incidentally, the washing treatment and the above-described rinse polishing treatment are classified according to the place at which these treatments are performed, and the washing treatment is a surface treatment to be performed at a place which is not the top of the polishing table (platen) and is preferably a surface treatment to be performed after the object to be subjected to surface treatment has been removed from the polishing table (platen). In the washing treatment as well, defects on the surface of the object to be subjected to surface treatment can be removed by bringing the washing composition into direct contact with the object.

An example of the method for performing the washing treatment includes (i) a method in which the washing brush is brought into contact with one side or both sides of the object to be subjected to surface treatment in a state in which the object to be subjected to surface treatment is held and the surface of the object to be subjected to surface treatment is rubbed with the washing brush while supplying the washing composition to the contact portion, (ii) a method (dipping method) in which the object to be subjected to surface treatment is dipped in the washing composition and subjected to the ultrasonic treatment and stirring, and the like. In such methods, defects on the surface of the object to be polished are removed by the frictional force by the washing brush or the mechanical force generated by the ultrasonic treatment or stirring and the chemical action by the composition for surface treatment.

In the method of (i) above, the method for bringing the object to be subjected to surface treatment into contact with the washing composition is not particularly limited, but examples thereof may include a spin method in which the object to be subjected to surface treatment is rotated at a high speed while allowing the washing composition to flow from the nozzle onto the object to be subjected to surface treatment, a spray method in which the object to be subjected to surface treatment is washed by spraying the washing composition onto the object, and the like.

It is preferable to employ a spin method and a spray method for the washing treatment and a spin method is still more preferable from the viewpoint of being able to more efficiently perform decontamination in a short time.

As an apparatus for performing such a washing treatment, there are a batch-type washing apparatus for simultaneously performing the surface treatment of a plurality of objects to be subjected to surface treatment which are accommodated in a cassette, a single washing apparatus in which one sheet of object to be subjected to surface treatment is fitted to a holder and the surface treatment is performed, and the like. A method using a single washing apparatus is preferable from the viewpoint of shortening the washing time and the like.

Furthermore, examples of an apparatus for performing the washing treatment include a polishing apparatus equipped with a washing facility by which it is possible to rub the object with a washing brush after taking out the object to be subjected to surface treatment from the polishing table (platen). It is possible to more efficiently perform the washing treatment of the object to be subjected to surface treatment by using such a polishing apparatus.

As such a polishing apparatus, it is possible to use a general polishing apparatus having a holder for holding the object to be subjected to surface treatment, a motor capable of changing the revolution number, a washing brush and the like. As a polishing apparatus, either of a single-side polishing apparatus or a double-side polishing apparatus may be used. Incidentally, in the case of performing the rinse polishing step after the CMP step, it is more efficient and preferable to perform the washing treatment using an apparatus the same as the polishing apparatus used in the rinse polishing step.

The washing brush is not particularly limited, but preferably, a resin brush is used. The material for the resin brush is not particularly limited, but it is preferable to use, for example, PVA (polyvinyl alcohol). Moreover, as a washing brush, it is particularly preferable to use PVA sponge.

The washing conditions are also not particularly limited and can be appropriately set depending on the kind of object to be subjected to surface treatment and the kind and amount of defects to be removed.

In the method of (ii) above, the conditions in the washing method by dipping are not particularly limited, and known methods can be used.

When the washing treatment of (II) above is performed using the washing composition which is the composition for surface treatment according to an aspect of the present invention, the object to be subjected to surface treatment is preferably one after being subjected to the rinse polishing treatment.

Washing using water may be performed before the surface treatment according to the method of (I) or (II) above is performed.

(Post-Washing Treatment)

In addition, as a surface treatment method, it is preferable to further subject the polished object to be polished to a washing treatment after the surface treatment of (I) or (II) above using the composition for surface treatment according to an aspect of the present invention. In the present specification, this washing treatment is referred to as a post-washing treatment. Examples of the post-washing treatment include a method in which water or a washing composition (hereinafter also referred to as a post-washing composition) different from the composition for surface treatment according to the present invention is simply allowed to freely flow on the object to be subjected to surface treatment, a method in which the object to be subjected to surface treatment is simply dipped in water or the post-washing composition, and the like. In addition, examples thereof include a method in which the washing brush is brought into contact with one side or both sides of the object to be subjected to surface treatment in a state in which the object to be subjected to surface treatment is held and the surface of the object to be subjected to surface treatment is rubbed with the washing brush while supplying water or the post-washing composition to the contact portion, a method (dipping method) in which the object to be subjected to surface treatment is dipped in water or the post-washing composition and subjected to the ultrasonic treatment and stirring, and the like in the same manner as the surface treatment by the method of (II) described above. Among these, a method in which the washing brush is brought into contact with one side or both sides of the object to be subjected to surface treatment in a state in which the object to be subjected to surface treatment is held and the surface of the object to be subjected to surface treatment is rubbed with the washing brush while supplying water or the post-washing composition to the contact portion is preferable. Incidentally, as an apparatus and conditions for the post-washing treatment, it is possible to use the same apparatus and conditions as those for the surface treatment of (II) described above. Here, as the water or post-washing composition to be used in the post-washing treatment, water or a known washing composition can be used, but it is preferable to use water, particularly deionized water among these. By the surface treatment according to an aspect of the present invention, the ceria residues and the organic residues are directly removed and these residues remaining in a significantly small amount thereafter are also in a state of being extremely easily removed. For this reason, the ceria residues and the organic residues are extremely favorably removed by performing a further washing treatment using water or a post-washing composition after the surface treatment of an aspect of the present invention.

In addition, it is preferable that the water droplets attached to the surface of the object to be subjected to surface treatment after being washed are eliminated using a spin dryer or the like and the object is dried. In addition, the surface of the object to be subjected to surface treatment may be dried by air blow drying.

(Polishing Treatment of Object to be Polished Using Polishing Composition Containing Ceria)

The surface treatment method according to an aspect of the present invention is a surface treatment method which includes performing a surface treatment of an object to be subjected to surface treatment (polished object to be polished) obtained after being polished using a polishing composition containing ceria. For this reason, it is more preferable that the surface treatment method according to an aspect of the present invention includes polishing the object to be polished by the polishing method to be described later before the surface treatment is performed.

The polishing treatment is not particularly limited as long as it is a treatment for polishing a semiconductor substrate but is preferably a chemical mechanical polishing (CMP) step. In addition, the polishing treatment may be a polishing treatment including a single step or a polishing treatment including a plurality of steps. Examples of the polishing treatment including a plurality of steps include a polishing treatment in which a finish polishing step is performed after a preliminary polishing step (rough polishing step), a polishing treatment in which one or two or more secondary polishing steps are performed after the primary polishing step and then a final polishing step is performed, and the like. The surface treatment step using the composition for surface treatment according to an aspect of the present invention is preferably performed after the finish polishing.

If the polishing composition is a polishing composition containing ceria which is a premise to obtain the effects of the surface treatment method according to an aspect of the present invention, known polishing compositions can be appropriately used depending on the properties of the semiconductor substrate. One of the specific examples of such a polishing composition includes a polishing composition in which 1.0 mass % of MIREK (registered trademark) E05 (MITSUI MINING & SMELTING CO., LTD.) and 0.1 mass % of sodium polyacrylate (weight average molecular weight: 10000) are contained in water as a dispersing medium and the pH is adjusted to 4 using acetic acid, and the like.

As the polishing apparatus, it is possible to use a general polishing apparatus to which a holder for holding the object to be polished, a motor capable of changing the revolution number, and the like are attached and which has a polishing table to which a polishing pad (polishing cloth) can be attached. As a polishing apparatus, either of a single-side polishing apparatus or a double-side polishing apparatus may be used. Specifically, for example, a washing apparatus-integrated polishing apparatus MirraMesa (registered trademark) manufactured by Applied Materials, Inc. and the like can be preferably used. Here, as the polishing apparatus used for the polishing treatment, it is more efficient and preferable to use the same one as the polishing apparatus used for the rinse polishing treatment described above.

As the polishing pad, general non-woven fabric, polyurethane, porous fluororesin and the like can be used without particular limitation. It is preferable that the polishing pad has been subjected to grooving so as to retain the polishing composition.

The polishing conditions are not particularly limited, and, for example, the revolution number of the polishing table and the revolution number of the head (carrier) are preferably 10 rpm or more and 100 rpm or less and the pressure (polishing pressure) applied to the object to be polished is preferably 0.5 psi or more and 10 psi or less. The method for supplying the polishing composition to the polishing pad is not particularly limited, and, for example, a method (free-flowing) in which the polishing composition is continuously supplied to the polishing pad using a pump or the like is employed. There is no limitation on this supplied amount, but it is preferable that the surface of the polishing pad is always covered with the polishing composition and the supplied amount is preferably 10 mL/min or more and 5000 mL/min or less. The polishing time is also not particularly limited but is preferably 5 seconds or more and 180 seconds or less in the step using the polishing composition.

(Defect Removing Effect)

It is more preferable as the effect of removing the ceria residues (particularly particle residues derived from ceria) and organic residues on the surface of an object to be subjected to surface treatment by the composition for surface treatment according to an aspect of the present invention is higher. It is preferable that the numbers of particle residues and organic residues after the surface treatment of the object to be subjected to surface treatment performed using the composition for surface treatment (after the post-washing treatment or drying in the case of performing the post-washing treatment or drying thereafter) are each in the ranges to be described later. The upper limit value of the number of particle residues is preferably 100 or less, more preferably 80 or less, still more preferably 70 or less, yet still more preferably 60 or less, particularly preferably 50 or less, extremely preferably 40 or less, and most preferably 30 or less (lower limit: 0). In addition, the upper limit value of the number of organic residues is preferably 80 or less, more preferably 50 or less, still more preferably 25 or less, yet still more preferably 15 or less, particularly preferably 10 or less, extremely preferably 5 or less, and most preferably 3 or less (lower limit: 0). Incidentally, the numbers of particle residues and organic residues can be measured using a wafer defect inspection apparatus and SEM or EDX elemental analysis. The details of the measurement method of these will be described later in Examples.

<Method for Manufacturing Semiconductor Substrate>

A still another aspect of the present invention is a method for manufacturing a semiconductor substrate, which includes performing a surface treatment by the surface treatment method according to an aspect of the present invention and in which the object to be subjected to surface treatment (polished object to be polished) is a polished semiconductor substrate. In other words, the method for manufacturing a semiconductor substrate according to an aspect of the present invention includes polishing a semiconductor substrate using a polishing composition containing ceria to obtain a polished semiconductor substrate and subjecting the polished semiconductor substrate to a surface treatment by the surface treatment method according to an aspect of the present invention.

EXAMPLES

The present invention will be described in more detail with reference to the following Examples and Comparative Examples. However, the technical scope of the present invention is not limited only to the following Examples.

<Preparation of Composition for Surface Treatment Nos. 1 to 35>

The (co)polymers and various kinds of additives presented in Tables 1 to 3 were added to water as a solvent so as to have the contents presented in Tables 1 to 3 and mixed with the water by stirring, thereby obtaining a composition for surface treatment (mixing temperature: about 25° C., mixing time: about 10 minutes). Here, the pH of the composition for surface treatment was adjusted using the pH adjusting agents presented in Tables 1 to 3, and the pH was confirmed using a pH meter (model number: LAQUA (registered trademark) manufactured by HORIBA, Ltd.).

In the tables, as a polyacrylate and a polystyrene sulfonate, an ammonium salt of polyacrylic acid and a sodium salt of polystyrenesulfonic acid were used, respectively.

Incidentally, with regard to sodium 2-naphthol-6-sulfonate hexahydrate, the added amount in the state of a hydrate was described as the content in the tables.

In addition, Belclene (registered trademark) 400 manufactured by BWA Water Additives was used as a phosphinocarboxylic acid copolymer in the tables, CHELEST (registered trademark) PH210 manufactured by CHELEST CORPORATION was used as hydroxyethylidene-diphosphonic acid, and K30 manufactured by Tokyo Chemical Industry Co., Ltd. was used as polyvinyl pyrrolidone, respectively.

Moreover, a copolymer of sodium styrene sulfonate with methacrylic acid (partial structure derived from sodium styrene sulfonate:partial structure derived from methacrylic acid=20:80 (molar ratio)) was described as sodium styrene sulfonate/methacrylic acid copolymer (20/80) in the tables.

(Weight Average Molecular Weight)

The measurement conditions for the weight average molecular weight (Mw) (in terms of polyethylene glycol) of the (co)polymers are as follows. The results are presented as the molecular weight in Tables 1 to 3 below.

GPC apparatus: manufactured by Shimadzu Corporation
Model: Prominence+ELSD detector (ELSD-LTII)
Column: VP-ODS (manufactured by Shimadzu Corporation)
Mobile phase A: MeOH
B: 1% aqueous solution of acetic acid
Flow rate: 1 mL/min
Detector: ELSD temp. 40° C., Gain 8, N2GAS 350 kPa
Oven temperature: 40° C.
Injection volume: 40 μL.

Moreover, the weight average molecular weight (Mw) of polyvinyl alcohol used as a wetting agent is the value determined under the following conditions in conformity to the known gel permeation chromatography (GPC) measurement method when the weight average molecular weight of polyvinyl alcohol is determined.

Column: Shodex (registered trademark) OHpak SB-806 HQ+SB-803 HQ (8.0 mm ID×300 mm each) (manufactured by SHOWA DENKO K.K.)
Mobile phase: 0.1 M NaCl aqueous solution
Flow rate: 1.0 mL/min
Detector: Shodex (registered trademark) RI (manufactured by SHOWA DENKO K.K.)
Column temperature: 40° C.

TABLE 1-1

(Prescription of each composition for surface treatment)

| No. | pH | (Co)polymer Kind | Molecular weight | Content (g/L) | Additive Kind | Content (g/L) | pH adjusting agent | |
|---|---|---|---|---|---|---|---|---|
| 1 | 5 | Nil | | 0 | Nil | 0 | Citric acid/ ammonia water | Comparative Example |
| 2 | 5 | Polyacrylate | 6000 | 1 | Nil | 0 | Citric acid/ ammonia water | Comparative Example |
| 3 | 5 | Polystyrene sulfonate | 25000 | 1 | Nil | 0 | Citric acid/ ammonia water | Comparative Example |
| 4 | 5 | Polyvinyl alcohol | 10000 | 1 | Nil | 0 | Citric acid/ ammonia water | Comparative Example |
| 5 | 5 | Nil | | 0 | Ammonium nitrate | 5 | Citric acid/ ammonia water | Comparative Example |
| 6 | 5 | Polyacrylate | 6000 | 1 | Ammonium nitrate | 5 | Citric acid/ ammonia water | Example |
| 7 | 5 | Polyacrylate | 6000 | 1 | 2-(Hydroxymethyl)-2-nitro-1,3-propanediol | 5 | Citric acid/ ammonia water | Example |
| 8 | 5 | Polyacrylate | 6000 | 1 | Ammonium sulfate | 5 | Citric acid/ ammonia water | Example |
| 9 | 5 | Polyacrylate | 6000 | 1 | Isethionic acid | 5 | Citric acid/ ammonia water | Example |
| 10 | 5 | Polyacrylate | 6000 | 1 | m-Xylenesulfonic acid | 5 | Citric acid/ ammonia water | Example |
| 11 | 5 | Polyacrylate | 6000 | 1 | Sodium 1-naphthalenesulfonate | 5 | Acetic acid/ ammonia water | Example |
| 12 | 5 | Polyacrylate | 6000 | 1 | Sodium 2-naphthol-6-sulfonate hydrate | 5 | Maleic acid/ ammonia water | Example |
| 13 | 5 | Polyacrylate | 6000 | 1 | p-Toluidine-2-sulfonic acid | 5 | Iminodiacetic acid/ ammonia water | Example |
| 14 | 5 | Polyacrylate | 6000 | 1 | Benzenesulfonic acid | 5 | Malonic acid/ ammonia water | Example |
| 15 | 5 | Polyacrylate | 6000 | 1 | Dodecylbenzenesulfonic acid | 0.1 | Citric acid/ ammonia water | Example |
| 16 | 5 | Polyacrylate | 6000 | 1 | Sodium di-(2-ethylhexyl) sulfosuccinate | 0.1 | Citric acid/ ammonia water | Example |
| 17 | 5 | Polyacrylate | 2000 | 1 | Isethionic acid | 5 | Citric acid/ ammonia water | Example |
| 18 | 5 | Polyacrylate | 25000 | 1 | Isethionic acid | 5 | Citric acid/ ammonia water | Example |
| 19 | 5 | Polyacrylate | 100000 | 1 | Isethionic acid | 5 | Citric acid/ ammonia water | Example |
| 20 | 5 | Polyacrylate | 1000000 | 1 | Isethionic acid | 5 | Citric acid/ ammonia water | Example |

TABLE 1-2

(Prescription of each composition for surface treatment)

| | | (Co)polymer | | | Additive | | | |
| --- | --- | --- | --- | --- | --- | --- | --- | --- |
| No. | pH | Kind | Molecular weight | Content (g/L) | Kind | Content (g/L) | pH adjusting agent | |
| 21 | 2 | Polyacrylate | 6000 | 1 | m-Xylenesulfonic acid | 5 | Citric acid/ ammonia water | Example |
| 22 | 7 | Polyacrylate | 6000 | 1 | m-Xylenesulfonic acid | 5 | Citric acid/ ammonia water | Example |
| 23 | 10 | Polyacrylate | 6000 | 1 | m-Xylenesulfonic acid | 5 | Citric acid/ ammonia water | Comparative Example |
| 24 | 5 | Polyacrylate | 6000 | 0.001 | Sodium 1-naphthalenesulfonate | 5 | Citric acid/ ammonia water | Example |
| 25 | 5 | Polyacrylate | 6000 | 0.1 | Sodium 1-naphthalenesulfonate | 5 | Citric acid/ ammonia water | Example |
| 26 | 5 | Polyacrylate | 6000 | 5 | Sodium 1-naphthalenesulfonate | 5 | Citric acid/ ammonia water | Example |
| 27 | 5 | Phosphinocarboxylic acid copolymer | 500 | 1 | Sodium 2-naphthol-6-sulfonate hydrate | 5 | Citric acid/ ammonia water | Example |
| 28 | 5 | Sodium styrenesulfonate/methacrylic acid copolymer (20/80) | 13000 | 1 | Sodium 2-naphthol-6-sulfonate hydrate | 5 | Citric acid/ ammonia water | Example |
| 29 | 5 | Polyacrylate | 6000 | 1 | Hydroxyethylidene diphosphonic acid | 5 | Citric acid/ ammonia water | Comparative Example |

TABLE 2

(Prescription of each composition for surface treatment)

| | | (Co)polymer | | | Additive | | Abrasive grain | | | |
| --- | --- | --- | --- | --- | --- | --- | --- | --- | --- | --- |
| No. | pH | Kind | Molecular weight | Content (g/L) | Kind | Content (g/L) | Kind | Content (g/L) | pH adjusting agent | |
| 1 | 5 | Nil | | 0 | Nil | 0 | Nil | 0 | Citric acid/ ammonia water | Comparative Example |
| 9 | 5 | Polyacrylate | 6000 | 1 | Isethionic acid | 5 | Nil | 0 | Citric acid/ ammonia water | Example |
| 30 | 5 | Nil | | 0 | Nil | 0 | Abrasive grain B (Note 1) | 1 | Citric acid/ ammonia water | Comparative Example |
| 31 | 5 | Polyacrylate | 6000 | 1 | Isethionic acid | 5 | Abrasive grain B (Note 1) | 1 | Citric acid/ ammonia water | Example |
| 32 | 5 | Nil | | 0 | Nil | 0 | Abrasive grain B (Note 1) | 2.5 | Citric acid/ ammonia water | Comparative Example |
| 33 | 5 | Polyacrylate | 6000 | 1 | Isethionic acid | 5 | Abrasive grain B (Note 1) | 2.5 | Citric acid/ ammonia water | Example |

(Note 1) Abrasive grain B: colloidal silica in which sulfonic acid is immobilized on surface (average primary particle size: 32 nm, average secondary particle size: 70 nm)

TABLE 3

(Prescription of each composition for surface treatment)

| | | (Co)polymer | | | Additive | | Wetting agent | | | |
| --- | --- | --- | --- | --- | --- | --- | --- | --- | --- | --- |
| No. | pH | Kind | Molecular weight | Content (g/L) | Kind | Content (g/L) | Kind | Content (g/L) | pH adjusting agent | |
| 2 | 5 | Polyacrylate | 6000 | 1 | Nil | 0 | Nil | 0 | Citric acid/ ammonia water | Comparative Example |
| 9 | 5 | Polyacrylate | 6000 | 1 | Isethionic acid | 5 | Nil | 0 | Citric acid/ ammonia water | Example |
| 34 | 5 | Polyacrylate | 6000 | 1 | Isethionic acid | 5 | Polyvinyl alcohol (Mw = 10000) | 1 | Citric acid/ ammonia water | Example |
| 35 | 5 | Polyacrylate | 6000 | 1 | Isethionic acid | 5 | Polyvinyl pyrrolidone | 1 | Citric acid/ ammonia water | Example |

<Preparation of Polished Object to be Polished (Object to be Subjected to Surface Treatment)>

A polished silicon nitride substrate, a polished TEOS substrate, and a polished polysilicon substrate after being polished by the following chemical mechanical polishing (CMP) step were respectively prepared as an object to be subjected to surface treatment.

[CMP Step]

The silicon nitride substrate, TEOS substrate, and polysilicon substrate which were a semiconductor substrate were subjected to polishing under the following conditions using a polishing composition C containing ceria (a polishing composition in which 1.0 mass % of MIREK (registered trademark) E05 (MITSUI MINING & SMELTING CO., LTD.) and 0.1 mass % of sodium polyacrylate (weight average molecular weight: 10000) were contained in water as a dispersing medium and the pH is adjusted to 4 using acetic acid). Here, a 200 mm wafer was used as the silicon nitride substrate, TEOS substrate, and polysilicon substrate.

(Polishing Apparatus and Polishing Condition)

Washing apparatus-integrated polishing apparatus: MirraMesa (registered trademark) manufactured by Applied Materials, Inc.

Polishing pad: Hard Polyurethane Pad IC1010 manufactured by NITTA HAAS INCORPORATED Polishing pressure: 2.0 psi (1 psi=6894.76 Pa, and so forth)

Revolution number of polishing table: 60 rpm

Revolution number of head: 60 rpm

Supply of polishing composition: free-flowing

Amount of polishing composition supplied: 100 mL/min

Polishing time: 60 seconds,

Object to be polished: 200 mm wafer;

Silicon nitride substrate: one manufactured by low pressure chemical vapor deposition (LPCVD) (thickness: 2500 Å), TEOS substrate: one manufactured by physical vapor deposition (PVD) (thickness: 10000 Å), and Polysilicon substrate: one manufactured by low pressure chemical vapor deposition (LPCVD) (thickness: 5000 Å).

<Surface Treatment Method>

The polished silicon nitride substrate, polished TEOS substrate, and polished polysilicon substrate after being polished by the CMP step were subjected to rinse polishing under the following conditions.

<Surface Treatment Step>

(Rinse Polishing Treatment 1: Polishing Apparatus for Rinse and Rinse Polishing Condition)

Washing apparatus-integrated polishing apparatus: MirraMesa (registered trademark) manufactured by Applied Materials, Inc.

Polishing pad: Hard Polyurethane Pad IC1010 manufactured by NITTA HAAS INCORPORATED Polishing pressure: 1.0 psi Revolution number of polishing table: 60 rpm Revolution number of head: 60 rpm Kind of polishing composition: water (deionized water)

Supply of polishing composition: free flowing

Amount of polishing composition supplied: 100 mL/min

Polishing time: 30 seconds.

(Rinse Polishing Treatment 2: Polishing Apparatus for Rinse and Rinse Polishing Condition)

The rinse polishing treatment 2 was continuously performed after the rinse polishing treatment 1 using a polishing table different from that for the rinse polishing treatment 1 under the following conditions.

Washing apparatus-integrated polishing apparatus: MirraMesa (registered trademark) manufactured by Applied Materials, Inc.

Polishing pad: Hard Polyurethane Pad IC1010 manufactured by NITTA HAAS INCORPORATED Polishing pressure: 1.0 psi Revolution number of polishing table: 60 rpm Revolution number of head: 60 rpm Kind of polishing composition: composition for surface treatment Nos. 1 to 35

Supply of polishing composition: free-flowing Amount of polishing composition supplied: 100 mL/min Polishing time: 60 seconds.

(Post-Washing Treatment Step)

(Post-Washing Treatment: Post-Washing Apparatus and Post-Washing Condition)

After the rinse polishing treatment 2, the polished silicon nitride substrate, polished TEOS substrate, and polished polysilicon substrate after being polished in the rinse polishing step were pulled up while applying the composition for surface treatment thereonto and taken out. Subsequently, the respective polished objects to be polished of the polished silicon nitride substrate, polished TEOS substrate, and polished polysilicon substrate after being polished in the rinse polishing step 2 were washed using water (deionized water) by a washing method in which each polished object to be polished was rubbed using polyvinyl alcohol (PVA) sponge which was a washing brush under the following conditions while applying pressure thereto.

Washing apparatus-integrated polishing apparatus: MirraMesa (registered trademark) manufactured by Applied Materials, Inc.

Revolution number of washing brush: 100 rpm

Revolution number of polished object to be polished: 50 rpm

Kind of washing composition: water (deionized water)

Amount of washing composition supplied: 1000 mL/min

Washing time: 60 seconds.

<Evaluation>

The following items were measured and evaluated for the respective polished objects to be polished after being subjected to the post-washing treatment. The evaluation results are presented in Tables 4 to 7 together.

[Evaluation on Total Number of Defects]

The polished object to be polished after being subjected to the surface treatment using each composition for surface treatment by the surface treatment method described above and further to the post-washing treatment was subjected to the measurement of the number of defects to be 0.13 μm or more. For the measurement of the number of defects, a wafer defect inspection apparatus SP-2 manufactured by KLA-TENCOR Corporation was used. As the measurement, the remaining portion excluding a portion to 5 mm in width (a portion from 0 mm in width to 5 mm in width when the outer peripheral end is regarded as 0 mm) from the outer peripheral end of one side of the polished object to be polished was subjected to the measurement.

[Evaluation on Number of Particle Residue]

The polished object to be polished after being subjected to the surface treatment using each composition for surface treatment by the surface treatment method described above and further to the post-washing treatment was subjected to the measurement of the number of particle residues by SEM observation using Review SEM RS6000 manufactured by Hitachi, Ltd. First, 100 defects present in the remaining portion excluding a portion to 5 mm in width (a portion from 0 mm in width to 5 mm in width when the outer peripheral end is regarded as 0 mm) from the outer peripheral end of one side of the polished substrate to be polished were sampled by SEM observation. Subsequently, the percentage (%) of particle residues among the defects was calculated by visually distinguishing the particle residues among the 100 defects sampled by SEM observation and confirming the number of particle residues. Thereafter, the product of the number of defects (pieces) to be 0.13 µm or more measured using a wafer defect inspection apparatus SP-2 manufactured by KLA-TENCOR Corporation in the evaluation of the number of defects described above and the percentage (%) of particle residues among the defects calculated from the SEM observation result was calculated as the number of particle residues (pieces).

Moreover, the elemental analysis of the particle residues was performed using an energy dispersive X ray analyzer (EDX), and a result, it has been confirmed that the particle residues are derived from ceria.

[Evaluation on Number of Organic Residues]

The polished object to be polished after being subjected to the surface treatment using each composition for surface treatment by the surface treatment method described above and further to the post-washing treatment was subjected to the measurement of the number of organic residues by SEM observation using Review SEM RS6000 manufactured by Hitachi, Ltd. First, 100 defects present in the remaining portion excluding a portion to 5 mm in width (a portion from 0 mm in width to 5 mm in width when the outer peripheral end is regarded as 0 mm) from the outer peripheral end of one side of the polished object to be polished were sampled by SEM observation. Subsequently, the percentage (%) of organic residues among the defects was calculated by visually distinguishing the organic residues among the 100 defects sampled by SEM observation and confirming the number of organic residues. Thereafter, the product of the number of defects (pieces) to be 0.13 µm or more measured using a wafer defect inspection apparatus SP-2 manufactured by KLA-TENCOR Corporation in the evaluation of the number of defects described above and the percentage (%) of organic residues among the defects calculated from the SEM observation result was calculated as the number of organic residues (pieces).

[Evaluation on Number of Other Residue]

The number of other residues (pieces) was calculated by subtracting the value of the number of particle residues and the value of the number of organic residues from the value of the total number of defects.

The evaluation results for the respective compositions for surface treatment in the case of using a polished silicon nitride substrate as an object to be subjected to surface treatment are presented in Tables 4 and 5, the evaluation results for the respective compositions for surface treatment in the case of using a polished TEOS substrate are presented in Table 6, and the evaluation results for the respective compositions for surface treatment in the case of using a polished polysilicon substrate are presented in Table 7, respectively.

TABLE 4

(Evaluation results of each composition for surface treatment for polished silicon nitride substrate)

| No. | Number of particle residues (pieces) | Number of organic residues (pieces) | Number of other residues (pieces) | Total number of defects (pieces) | |
|---|---|---|---|---|---|
| 1 | 305 | 191 | 42 | 538 | Comparative Example |
| 2 | 133 | 6 | 2 | 141 | Comparative Example |
| 3 | 5244 | 7 | 0 | 5251 | Comparative Example |
| 4 | 542 | 42 | 3 | 587 | Comparative Example |
| 5 | 1230 | 268 | 62 | 1560 | Comparative Example |
| 6 | 39 | 3 | 0 | 42 | Example |
| 7 | 41 | 4 | 1 | 46 | Example |
| 8 | 30 | 3 | 0 | 33 | Example |
| 9 | 28 | 4 | 0 | 32 | Example |
| 10 | 30 | 3 | 0 | 33 | Example |
| 11 | 28 | 2 | 0 | 30 | Example |
| 12 | 30 | 1 | 0 | 31 | Example |
| 13 | 35 | 3 | 0 | 38 | Example |
| 14 | 38 | 6 | 0 | 44 | Example |
| 15 | 62 | 3 | 0 | 65 | Example |
| 16 | 45 | 4 | 0 | 49 | Example |
| 17 | 22 | 2 | 0 | 24 | Example |
| 18 | 53 | 6 | 1 | 60 | Example |
| 19 | 27 | 3 | 1 | 30 | Example |
| 20 | 16 | 3 | 0 | 19 | Example |
| 21 | 78 | 8 | 3 | 89 | Example |
| 22 | 38 | 13 | 2 | 52 | Example |
| 23 | 3857 | 2040 | 334 | 6231 | Comparative Example |
| 24 | 97 | 80 | 27 | 205 | Example |
| 25 | 65 | 6 | 4 | 75 | Example |
| 26 | 53 | 1 | 1 | 55 | Example |
| 27 | 59 | 3 | 0 | 62 | Example |
| 28 | 38 | 21 | 18 | 76 | Example |
| 29 | 134 | 5 | 0 | 139 | Comparative Example |

TABLE 5

(Evaluation results of each composition for surface treatment for polished silicon nitride substrate)

| No. | Number of particle residues (pieces) | Number of organic residues (pieces) | Number of other residues (pieces) | Total number of defects (pieces) | |
|---|---|---|---|---|---|
| 1 | 305 | 191 | 42 | 538 | Comparative Example |
| 9 | 28 | 4 | 0 | 32 | Example |
| 30 | 193 | 95 | 6 | 295 | Comparative Example |
| 31 | 19 | 3 | 1 | 23 | Example |
| 32 | 398 | 97 | 8 | 503 | Comparative Example |
| 33 | 43 | 9 | 1 | 53 | Example |

TABLE 6

(Evaluation results of each composition for surface treatment for polished TEOS substrate)

| No. | Number of particle residues (pieces) | Number of organic residues (pieces) | Number of other residues (pieces) | Total number of defects (pieces) | |
|---|---|---|---|---|---|
| 2 | 342 | 1 | 0 | 343 | Comparative Example |
| 9 | 140 | 1 | 0 | 141 | Example |

TABLE 7

(Evaluation results of each composition for surface treatment for polished polysilicon substrate)

| No. | Number of particle residues (pieces) | Number of organic residues (pieces) | Number of other residues (pieces) | Total number of defects (pieces) | |
|---|---|---|---|---|---|
| 2 | 10 | 186 | 0 | 197 | Comparative Example |
| 9 | 1 | 181 | 0 | 182 | Example |
| 34 | 8 | 41 | 0 | 49 | Example |
| 35 | 3 | 17 | 0 | 20 | Example |

As presented in Tables 4 and 5, it has been confirmed that the composition for surface treatment Nos. 6 to 22, 24 to 28, 31, and 33 according to an aspect of the present invention exhibit the effect of decreasing the number of particle residues and the number of organic residues after a polished object to be polished obtained after being polished using a polishing composition containing ceria is subjected to a surface treatment as compared to the composition for surface treatment Nos. 1 to 5, 23, 29, 30, and 32 which are out of the scope of the present invention in the case of using a polished silicon nitride substrate as an object to be subjected to surface treatment.

Moreover, the same tendency as that in Tables 4 and 5 has also been confirmed from the evaluation results in Tables 6 and 7 in which the object to be subjected to surface treatment has been changed from a polished silicon nitride substrate to a polished TEOS substrate or a polished polysilicon substrate.

As described above, it has been confirmed that the composition for surface treatment according to an aspect of the present invention sufficiently suppresses an organic residue while favorably decreasing a ceria residue on a polished object to be polished obtained after being polished using a polishing composition containing ceria.

This application is based upon and claims the benefit of priority of the prior Japanese Patent Application No. 2017-048630 filed on Mar. 14, 2017, the entire contents of which are incorporated herein by reference.

The invention claimed is:

1. A composition for surface treatment, which is for a surface treatment of a polished object to be polished obtained after being polished using a polishing composition containing ceria, the composition for surface treatment comprising:

a carboxy group-containing (co)polymer having a structural unit derived from a monomer having a carboxy group or a salt group of the carboxy group;

a $SO_x$ or $NO_y$ partial structure-containing compound having a partial structure represented by $SO_x$ or $NO_y$ (where x and y each independently are a real number 1 to 5); and a dispersing medium, wherein:

the $SO_x$ or $NO_y$ partial structure-containing compound is at least one selected from the group consisting of: 2-naphthol-6-sulfonic acid and salts thereof; p-toluidine-2-sulfonic acid and salts thereof; isethionic acid and salts thereof; and 2-(hydroxymethyl)-2-nitro-1,3-propanediol; and the composition for surface treatment has a pH of 1 or more and 8 or less.

2. The composition for surface treatment according to claim 1, wherein the carboxy group-containing (co)polymer is a (co)polymer having a structural unit derived from (meth)acrylic acid or a salt of (meth)acrylic acid.

3. The composition for surface treatment according to claim 1, wherein the $SO_x$ or $NO_y$ partial structure-containing compound is at least one selected from the group consisting of isethionic acid and salts thereof; and 2-naphthol-6-sulfonic acid and salts thereof.

4. The composition for surface treatment according to claim 1, further comprising silica having an organic acid immobilized on a surface.

5. The composition for surface treatment according to claim 1, further comprising a wetting agent.

6. The composition for surface treatment according to claim 1, wherein a molecular weight of the $SO_x$ or $NO_y$ partial structure-containing compound is less than 1000.

7. A method for producing the composition for surface treatment according to claim 1, comprising mixing the carboxy group-containing (co)polymer, the $SO_x$ or $NO_y$ partial structure-containing compound, and the dispersing medium.

8. A surface treatment method, comprising performing a surface treatment of a polished object to be polished using the composition for surface treatment according to claim 1.

9. The surface treatment method according to claim 8, further comprising performing a post-washing treatment of the polished object to be polished after the surface treatment.

10. A composition for surface treatment, which is for a surface treatment of a polished object to be polished obtained after being polished using a polishing composition containing ceria, the composition for surface treatment comprising:

a carboxy group-containing (co)polymer having a structural unit derived from a monomer having a carboxy group or a salt group of the carboxy group;

a $SO_x$ or $NO_y$ partial structure-containing compound having a partial structure represented by $SO_x$ or $NO_y$ (where x and y each independently are a real number 1 to 5); and a dispersing medium, wherein:

the $SO_x$ or $NO_y$ partial structure-containing compound is at least one selected from the group consisting of: m-xylenesulfonic acid and salts thereof; 2-naphthol-6-sulfonic acid and salts thereof; p-toluidine-2-sulfonic acid and salts thereof; benzenesulfonic acid and salts thereof; a compound represented by the following Chemical Formula (4) and salts thereof; and 2-(hydroxymethyl)-2-nitro-1,3-propanediol;

(4)

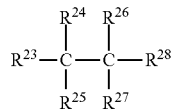

wherein $R^{23}$ to $R^{28}$ each independently denote a hydrogen atom, a hydroxy group, a sulfo group, an anionic group which does not have a sulfo group, a cationic group, an alkoxycarbonyl group having 2 to 11 carbon atoms, or a hydrocarbon group having 1 to 20 carbon atoms, and at least one of $R^{23}$ to $R^{28}$ is a sulfo group; and the composition for surface treatment has a pH of 5 or more and 8 or less.

11. The composition for surface treatment according to claim 10, wherein the $SO_x$ or $NO_y$ partial structure-containing compound is at least one selected from the group consisting of: m-xylenesulfonic acid and salts thereof; 2-naphthol-6-sulfonic acid and salts thereof; p-toluidine-2-sulfonic acid and salts thereof; a compound represented by the Chemical Formula (4) and salts thereof; and 2-(hydroxymethyl)-2-nitro-1,3-propanediol.

12. The composition for surface treatment according to claim 10, wherein the carboxy group-containing (co)polymer is a (co)polymer having a structural unit derived from (meth)acrylic acid or a salt of (meth)acrylic acid.

13. The composition for surface treatment according to claim 10, further comprising silica having an organic acid immobilized on a surface.

14. The composition for surface treatment according to claim 10, further comprising a wetting agent.

15. The composition for surface treatment according to claim 10, wherein a molecular weight of the $SO_x$ or $NO_y$ partial structure-containing compound is less than 1000.

16. A method for producing the composition for surface treatment according to claim 10, comprising mixing the carboxy group-containing (co)polymer, the $SO_x$ or $NO_y$ partial structure-containing compound, and the dispersing medium.

17. A surface treatment method, comprising performing a surface treatment of a polished object to be polished using the composition for surface treatment according to claim 10.

18. The surface treatment method according to claim 17, further comprising performing a post-washing treatment of the polished object to be polished after the surface treatment.

* * * * *